US012754247B2

(12) United States Patent
Kwok et al.

(10) Patent No.: US 12,754,247 B2
(45) Date of Patent: Oct. 6, 2026

(54) BATTERY SYSTEM DIAGNOSTICS USING ELECTROCHEMICAL IMPEDANCE SPECTROSCOPY

(71) Applicant: Caterpillar Inc., Peoria, IL (US)

(72) Inventors: Wellington Y. Kwok, Dunlap, IL (US); Jinhui Sun, Dunlap, IL (US); Jeffrey Abney, Morton, IL (US)

(73) Assignee: Caterpillar Inc., Peoria, IL (US)

( * ) Notice: Subject to any disclaimer, the term of this patent is extended or adjusted under 35 U.S.C. 154(b) by 409 days.

(21) Appl. No.: 18/439,131

(22) Filed: Feb. 12, 2024

(65) Prior Publication Data

US 2025/0258240 A1 Aug. 14, 2025

(51) Int. Cl.

| | |
|---|---|
| ***G01R 31/389*** | (2019.01) |
| ***G01R 31/382*** | (2019.01) |
| ***G01R 31/396*** | (2019.01) |
| ***H01M 10/42*** | (2006.01) |
| ***H01M 10/48*** | (2006.01) |

(52) U.S. Cl.

CPC ......... *G01R 31/389* (2019.01); *G01R 31/382* (2019.01); *G01R 31/396* (2019.01); *H01M 10/425* (2013.01); *H01M 10/482* (2013.01); *H01M 2010/4278* (2013.01)

(58) Field of Classification Search

CPC .. G01R 31/389; G01R 31/396; G01R 31/382; H01M 10/425; H01M 10/482; H01M 2010/4278

See application file for complete search history.

(56) References Cited

U.S. PATENT DOCUMENTS

| | | | | |
|---|---|---|---|---|
| 9,293,928 | B2 * | 3/2016 | Alexander .......... | H02J 13/1335 |
| 11,668,779 | B2 * | 6/2023 | Bertness .............. | G01R 35/005 324/426 |
| 11,973,202 | B2 * | 4/2024 | Bertness ................. | B60L 53/60 |
| 12,429,527 | B2 * | 9/2025 | Santhamma ......... | G01R 31/389 |
| 2022/0057350 | A1 | 2/2022 | Fasching et al. | |
| 2022/0365142 | A1 | 11/2022 | Schmidt | |
| 2023/0064240 | A1 | 3/2023 | Zhou et al. | |

FOREIGN PATENT DOCUMENTS

| | | | |
|---|---|---|---|
| WO | 2023035074 | A1 | 3/2023 |
| WO | 2023174895 | A1 | 9/2023 |
| WO | 2025071772 | A1 | 4/2025 |

OTHER PUBLICATIONS

Westerhoff, U. et al. "Analysis of Lithium-Ion Battery Models Based on Electrochemical Impedance Spectroscopy", Energy Technol. 2016, 4, pp. 1620-1630.

* cited by examiner

*Primary Examiner* — Elias Desta

(57) ABSTRACT

A detection system for a battery pack may include one or more monitoring devices configured to detect respective response signals, responsive to an EIS input signal applied to terminals of the battery pack, for a plurality of battery cells electrically connected to the terminals. The detection system may include a controller configured to transmit, to an EIS device, data indicating the respective response signals and identifying which of the plurality of battery cells generated the respective response signals.

20 Claims, 4 Drawing Sheets

BATTERY SYSTEM DIAGNOSTICS USING ELECTROCHEMICAL IMPEDANCE SPECTROSCOPY

TECHNICAL FIELD

The present disclosure relates generally to batteries and, for example, to battery system diagnostics using electrochemical impedance spectroscopy (EIS).

BACKGROUND

A machine may include one or more battery packs to provide power to components of the machine, such as lights, computer systems, and/or a motor, among other examples. A battery pack may be associated with a modular design that includes multiple battery modules. A battery module may include multiple battery cells. Alternatively, a battery pack may be associated with a cell-to-pack design, in which battery cells are integrated directly into a battery pack without the use of battery modules. Over time, a battery pack may experience performance and/or capacity declines that render the battery pack unsuitable for its original application (e.g., a highly-demanding application, such as powering an electric vehicle). However, the battery pack may retain a considerable amount of capacity and functionality to allow the battery pack to be used in a less-demanding application (referred to as a "second use" or a "second life" of the battery pack).

To ensure a suitability of a battery pack for a second use, or for other diagnostic purposes, the battery pack may be subjected to diagnostic testing. One diagnostic method is EIS, in which an EIS input signal is applied to the power terminals of the battery pack, and a response signal at the power terminals is measured. This single output signal produced by the battery pack indicates aggregate diagnostic information at the level of the battery pack, but lacks resolution to the level of individual cells of the battery pack. Accordingly, deficiencies of individual cells of the battery pack may go undetected using EIS (e.g., because each cell represents only a small fraction of the response signal). Moreover, performing EIS on individual cells of the battery pack may involve disassembling the battery pack and/or the battery modules to allow EIS signals to be applied to cell terminals, module bus bars (e.g., which are welded to terminals of multiple cells), and/or module power terminals. Furthermore, performing EIS on individual cells involves applying an EIS signal to each individual cell or module, and measuring the response signal of each individual cell or module, one at a time, which is slow and inefficient.

U.S. Patent Application Publication No. 20220057350 (the '350 publication) discloses in-situ impedance spectroscopy analysis of battery cells in multi-cell battery packs. The '350 publication discloses a cell battery pack that includes a first battery node, including a first node controller and a first battery cell, electrically coupled to the first node controller. The first node controller is configured to apply a signal to the first battery cell while the battery pack remains operational and providing power output. The cell battery pack of the '350 publication also includes a second battery node, including a second node controller and a second battery cell, electrically coupled to the second node controller. The '350 publication indicates that at least one of the first node controller or the battery pack controller is configured to determine an impedance of the first battery cell based on a response of the first battery cell to the signal applied to the first battery cell.

The '350 publication relates to in-situ analysis of battery cells of a battery pack, and the techniques of the '350 publication may be inapplicable to EIS testing of an offline battery pack. Moreover, the '350 publication describes input signals being applied to each battery cell individually utilizing a node controller for that battery cell, which is slow and inefficient. Furthermore, the techniques of the '350 publication are inapplicable to battery packs that do not employ a battery pack architecture that utilizes individual node controllers for each battery cell. For example, the techniques of the '350 publication would not enable cell-level analysis of a battery pack by applying a single input signal to pack-level terminals of the battery pack.

The detection system of the present disclosure solves one or more of the problems set forth above and/or other problems in the art.

SUMMARY

A method may include receiving, by a battery pack, an EIS input signal applied at terminals of the battery pack, where the terminals have an electrical connection to a plurality of battery cells of the battery pack. The method may include detecting, by one or more monitoring devices of the battery pack, respective response signals, responsive to the EIS input signal, of the plurality of battery cells. The method may include communicating, from the one or more monitoring devices to a controller of the battery pack, data indicating the respective response signals and identifying which of the plurality of battery cells generated the respective response signals. The method may include transmitting, by the controller, the data to an EIS device.

A battery pack may include a housing, a plurality of battery cells contained in the housing, and terminals electrically connected to the plurality of battery cells, where the terminals are accessible from an exterior of the housing. The battery pack may include one or more monitoring devices configured to detect, while the battery pack is in an assembled state, respective response signals, responsive to an EIS input signal applied to the terminals, for the plurality of battery cells. The battery pack may include a controller configured to receive, from the one or more monitoring devices, data indicating the respective response signals and identifying which of the plurality of battery cells generated the respective response signals, and transmit the data to an EIS device.

A detection system for a battery pack may include one or more monitoring devices configured to detect respective response signals, responsive to an EIS input signal applied to terminals of the battery pack, for a plurality of battery cells electrically connected to the terminals. The detection system may include a controller configured to transmit, to an EIS device, data indicating the respective response signals and identifying which of the plurality of battery cells generated the respective response signals.

DETAILED DESCRIPTION

This disclosure relates to a detection system, which is applicable to any battery pack that includes multiple battery cells. For example, the battery pack may include dozens or hundreds of battery cells connected in series to produce high output voltages (e.g., at least 500 volts or at least 1000 volts). Such battery packs may be used in electric vehicles, or the like. As used herein, "battery cell," "battery," and "cell" may be used interchangeably.

Figure 1:
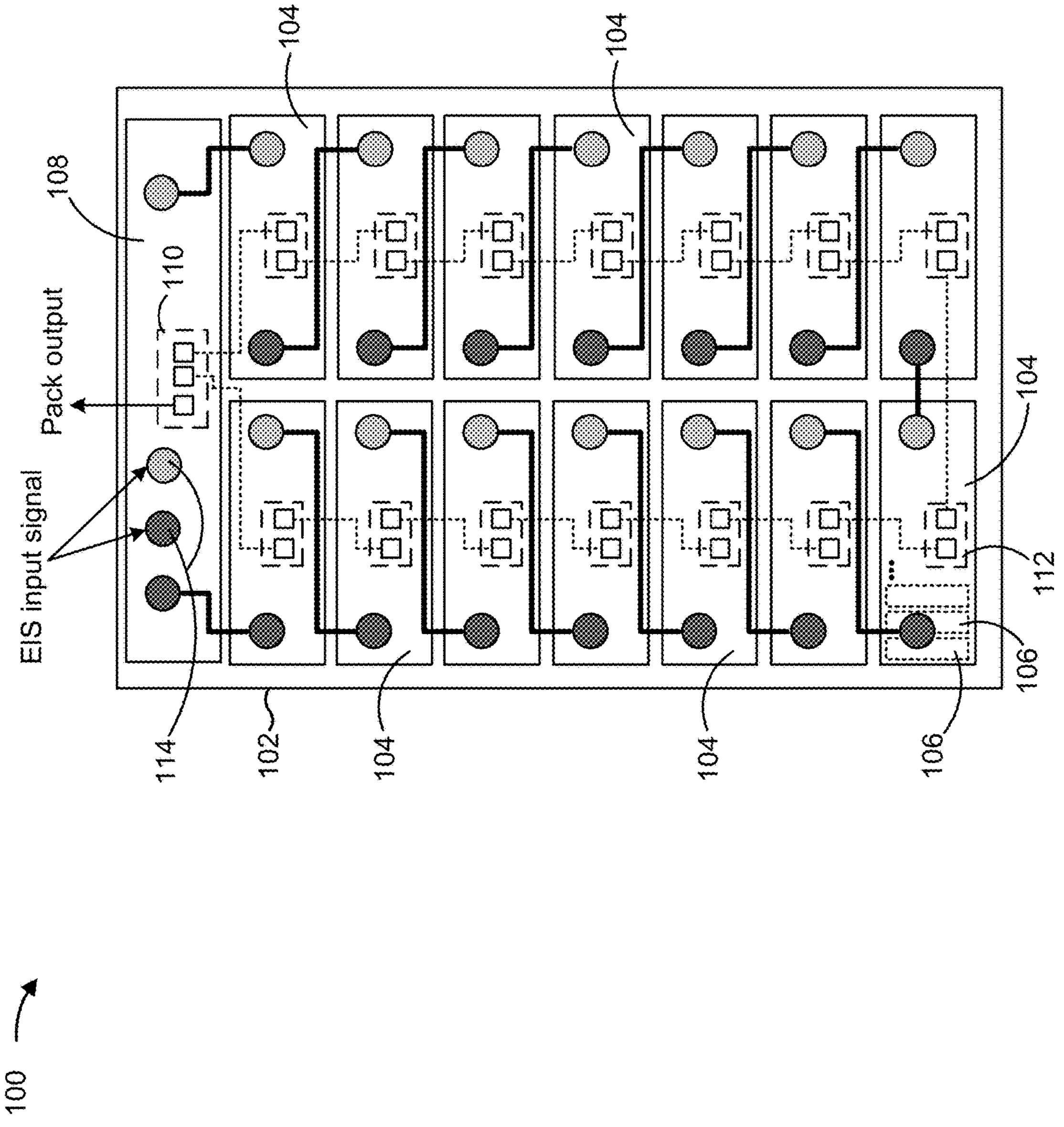
FIG. 1 is a diagram of an example battery pack.

FIG. 1 is a diagram of an example battery pack 100. The battery pack 100 is a multiple-cell battery pack. For example, the battery pack 100 may be a high-voltage battery pack 100. The battery pack 100 may include a battery pack housing 102, a plurality of battery modules 104, and a plurality of battery cells 106 (e.g., at least 50, at least 100, or at least 200 battery cells 106) grouped into the battery modules 104. The battery pack 100 includes a battery monitoring or management system (BMS) 108, which can be referred to interchangeably as a "battery monitoring system" or a "battery management system." The BMS 108 includes a battery pack controller 110 associated with storing information and/or controlling one or more operations associated with the battery pack 100. Furthermore, each battery module 104 includes a module controller 112 associated with storing information and/or controlling one or more operations associated with the battery module 104. A module controller 112 may be, may include, or may be included in, a cell monitoring unit (CMU), and the terms "module controller" and "CMU" may be used interchangeably herein. For example, the battery pack 100 may include a plurality of CMUs 112 configured to monitor respective battery modules 104 of the battery pack 100. The CMU 112 of a battery module 104 may be communicatively connected (e.g., by a wired connection) to respective sensors (not shown) connected to each of the battery cells 106 of the battery module 104 and configured to detect characteristics (e.g., electrical characteristics) of the battery cells 106.

The battery pack housing 102 may include metal shielding (e.g., steel, aluminum, or the like) to protect elements (e.g., battery modules 104, battery cells 106, the battery pack controller 110, the module controllers 112, wires, circuit boards, or the like) positioned within the battery pack housing 102. Each battery module 104 includes one or more (e.g., a plurality of) battery cells 106 (e.g., positioned within a housing of the battery module 104). Battery cells 106 may be connected in series and/or in parallel within the battery module 104 (e.g., via terminal-to-busbar welds). For example, the battery cells 106 may be connected in series to produce a high voltage output of the battery pack 100 (e.g., at least 500 volts or at least 1000 volts). Each battery cell 106 is associated with a chemistry type. The chemistry type may include lithium ion (Li-ion) (e.g., lithium ion polymer (Li-ion polymer), lithium iron phosphate (LFP), and/or nickel manganese cobalt (NMC)), nickel-metal hydride (NiMH), or nickel cadmium (NiCd), among other examples.

The battery modules 104 may be arranged within the battery pack 100 in one or more strings. For example, the battery modules 104 are connected via electrical connections, as shown in FIG. 1. The electrical connections may be removable, such as via bolts and/or nuts at one or more terminals on housings of the battery modules 104. The battery modules 104 may be connected in series and/or in parallel. For example, a number of battery modules 104 may be connected in series to provide a high voltage output of the battery pack 100. Alternatively, a number of battery modules 104 may be connected in parallel to increase a current and/or a power output of the battery pack 100. The number of battery cells 106 included in each battery module 104, and the number of battery modules 104 included in the battery pack 100 (e.g., and the relative serial and/or parallel connections of the battery cells 106 and/or the battery modules 104) may be associated with the required output power and an intended use of the battery pack 100. For example, any number of battery cells 106 can be included in a battery module 104. Similarly, any number of battery modules 104 can be included in the battery pack 100. Additionally, the module controllers 112 may be connected via electrical connections, as shown in FIG. 1. For example, the module controllers 112 may be connected in series (e.g., the module controllers 112 may have a daisy-chained configuration).

The battery pack controller 110 is communicatively connected (e.g., via a communication link) to each module controller 112. The battery pack controller 110 may be associated with receiving, generating, storing, processing, providing, and/or routing information associated with the battery pack 100. A module controller 112 may be associated with receiving, generating, storing, processing, providing, and/or routing information associated with a battery module 104. The module controller 112 may communicate with the battery pack controller 110.

The battery pack controller 110 and/or a module controller 112 includes one or more processors, one or more memories, and/or one or more communication components (e.g., one or more communication ports). A processor may include a central processing unit, a microprocessor, a controller, a microcontroller, a digital signal processor, a field-programmable gate array, an application-specific integrated circuit, and/or another type of processing component. The processor may be implemented in hardware, firmware, or a combination of hardware and software. In some implementations, the processor may include one or more processors capable of being programmed to perform one or more operations or processes described elsewhere herein. A memory may include volatile and/or nonvolatile memory. For example, the memory may include random access memory (RAM), read only memory (ROM), and/or another type of memory (e.g., a flash memory, a magnetic memory, and/or an optical memory). The memory may include internal memory (e.g., RAM, ROM, or a hard disk drive) and/or removable memory (e.g., removable via a universal serial bus connection). The memory may be a non-transitory computer-readable medium. The memory may store information, one or more instructions, and/or software (e.g., one or more software applications) related to the operation of the battery pack 100, a battery module 104, and/or a battery cell 106. The memory may include one or more memories that are coupled (e.g., communicatively coupled) to the processor, such as via a bus. Communicative coupling between a processor and a memory may enable the processor to read and/or process information stored in the memory and/or to store information in the memory.

The battery pack 100 may include terminals 114 (e.g., power terminals and/or high-voltage terminals). For example, the terminals 114 may include a positive terminal and a negative terminal of the battery pack 100. The terminals 114 may have an electrical connection to the plurality of battery modules 104, and thus an electrical connection to the plurality of battery cells 106 grouped into the battery modules 104. For example, the terminals 114 are pack-level terminals. The terminals 114 may be accessible from an exterior of the battery pack 100. For example, the terminals 114 may extend to, or may otherwise be accessible from, an exterior of the housing 102. During an EIS operation, an EIS input signal may be applied to the terminals 114, as shown. A pack output at the battery pack controller 110 (e.g., at a communication port of the battery pack controller 110) may indicate respective response signals of the battery cells 106 to the EIS input signal, as described herein.

As indicated above, FIG. 1 is provided as an example. Other examples may differ from what is described with regard to FIG. 1.

Figure 2:
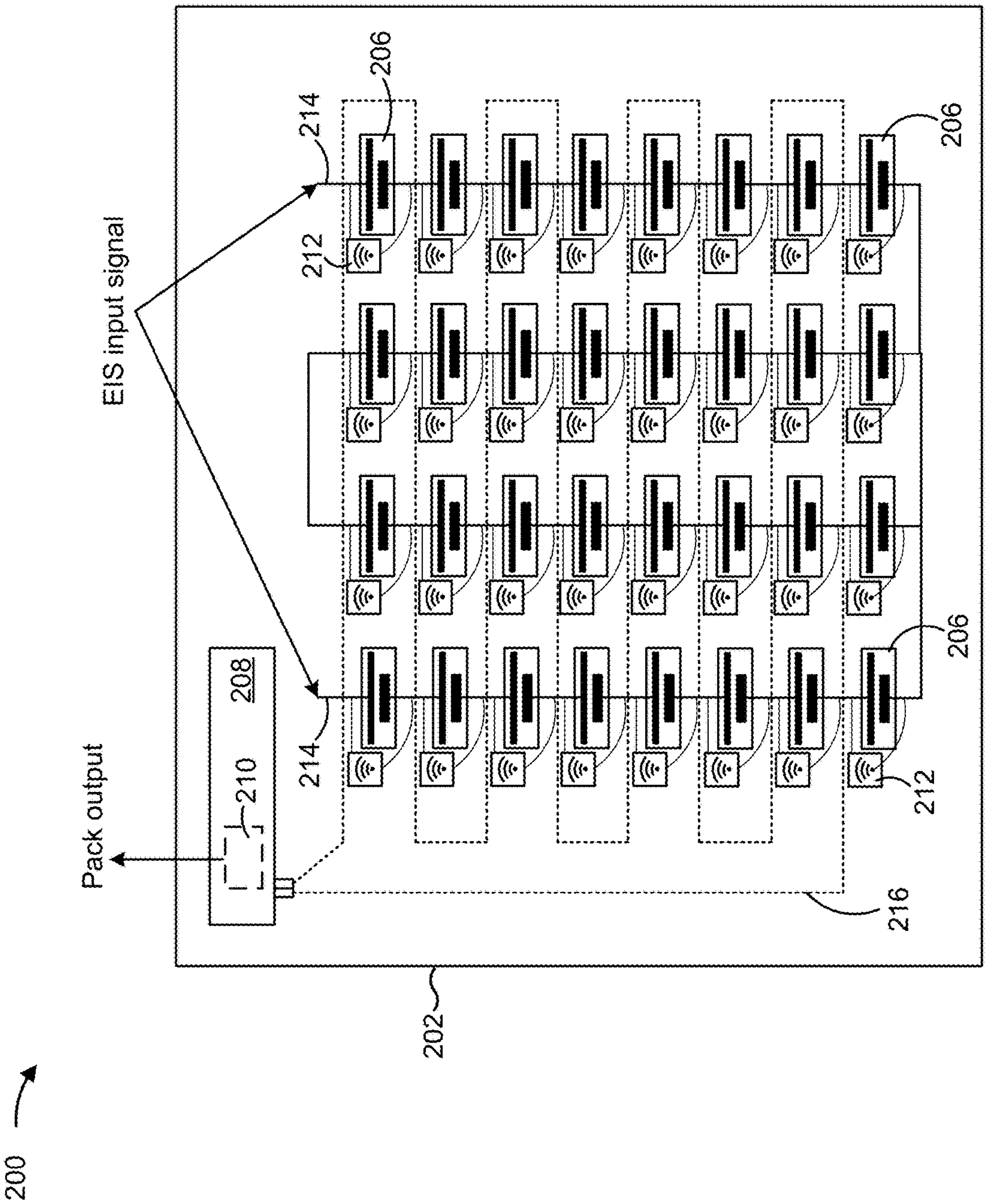
FIG. 2 is a diagram of an example battery pack.

FIG. 2 is a diagram of an example battery pack 200. The battery pack 200 is a multiple-cell battery pack. For example, the battery pack 200 may be a high-voltage battery pack 200. The battery pack 200 may include a battery pack housing 202 and a plurality of battery cells 206, in a similar manner as described in FIG. 1. The battery pack 200 may have a cell-to-pack configuration (e.g., the battery cells 206 are not grouped into battery modules). The battery pack 200 includes a BMS 208 that includes a battery pack controller 210, in a similar manner as described in FIG. 1.

The battery pack 200 may include a plurality of chip-on-cell devices 212 connected to (e.g., mounted on) respective battery cells 206 (e.g., in lieu of module-level CMUs). For example, a chip-on-cell device 212 may be electrically connected to a battery cell 206, to thereby draw power from the battery cell 206. A chip-on-cell device 212 may include one or more sensors configured to detect electrical characteristics (e.g., a voltage, a current, or the like) of a particular battery cell 206. The chip-on-cell device 212 may include a controller (e.g., including one or more memories and/or one or more processors, in a similar manner as described in FIG. 1) configured to control operations of the chip-on-cell device 212. The chip-on-cell device 212 may include a wireless communication component configured to wirelessly communicate with the battery pack controller 210 (e.g., using near-field communication). Components of the chip-on-cell device 212 described above may be implemented in one or more integrated circuit (IC) chips, such as field programmable gate array (FPGA) chips and/or application specific integrated circuit (ASIC) chips, among other examples. The chip-on-cell device 212 may include a substrate, such as a circuit board (e.g., a printed circuit board), and the components of the chip-on-cell device 212 described above may be mounted on the substrate or otherwise electrically connected to the substrate.

The wireless communication component of the chip-on-cell device 212 may include a transceiver and/or a separate receiver and transmitter that enables the wireless communication component to communicate with the battery pack controller 210. The wireless communication component may include a radio frequency (RF) interface, a wireless local area network interface, a cellular network interface, or the like. The wireless communication component may include an antenna for wireless communication. In some implementations, the wireless communication component is configured for near-field communication.

The BMS 208 and/or the battery pack controller 210 may also include a wireless communication component, similar to the wireless communication component of the chip-on-cell device 212. The wireless communication component of the BMS 208 and/or the battery pack controller 210 may include an antenna 216 for wireless communication. The antenna 216 may be a bus antenna as shown. For example, the antenna 216 may be configured in a path that passes near to each of the chip-on-cell devices 212 (e.g., near to the antennas of the chip-on-cell devices 212), thereby facilitating near-field communication. In some implementations, the battery pack controller 210 and the chip-on-cell devices 212 may wirelessly communicate using a different system and/or configuration from that described above.

The battery pack 200 may include terminals 214, in a similar manner as described in FIG. 1. For example, the terminals 214 may have an electrical connection to the plurality of battery cells 106. Additionally, the terminals 214 may be accessible from an exterior of the battery pack 200, in a similar manner as described in FIG. 1. During an EIS operation, an EIS input signal may be applied to the terminals 214, as shown. A pack output at the battery pack controller 210 (e.g., at a communication port of the battery pack controller 210) may indicate respective response signals of the battery cells 206 to the EIS input signal, as described herein.

As indicated above, FIG. 2 is provided as an example. Other examples may differ from what is described with regard to FIG. 2.

Figure 3:
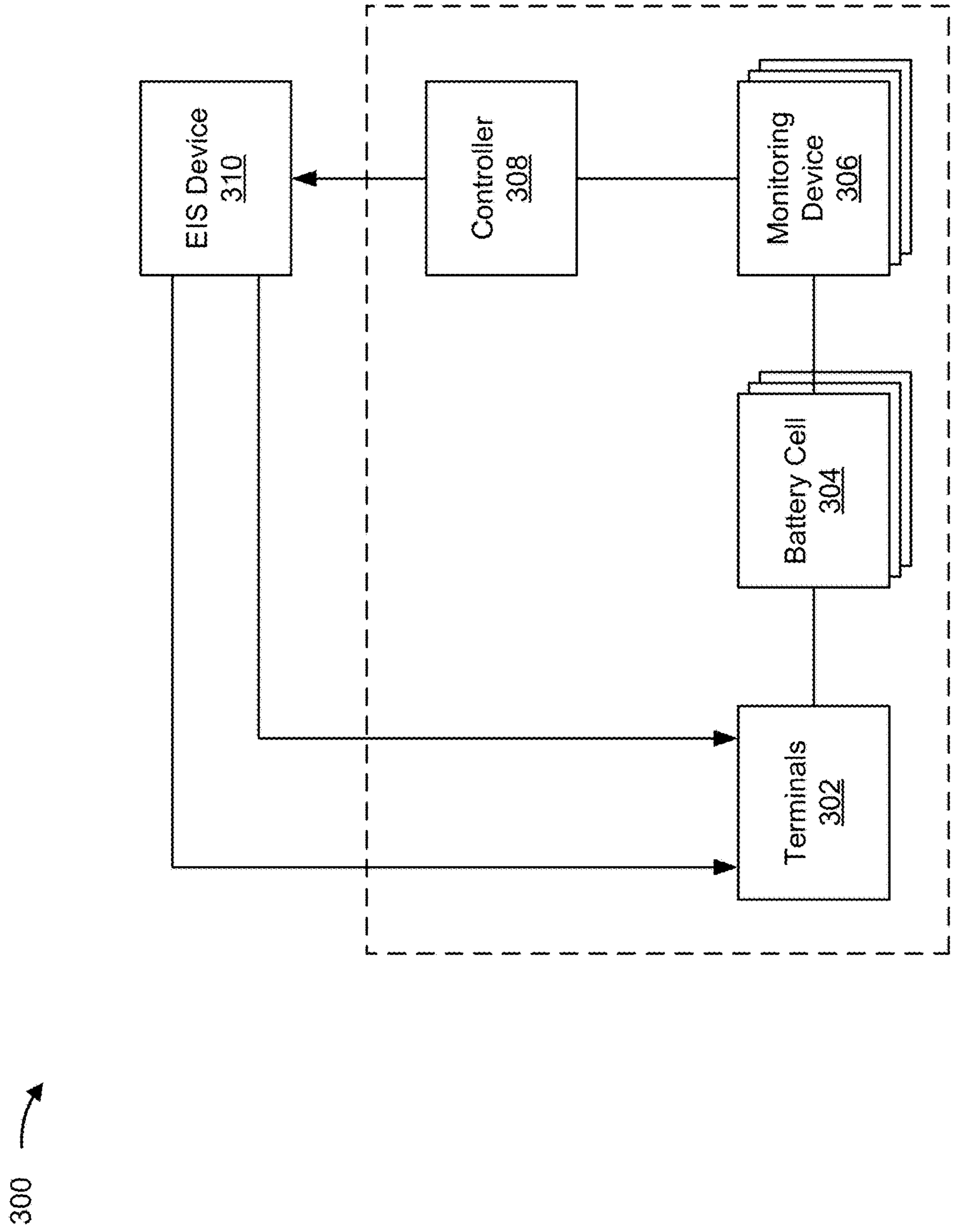
FIG. 3 is a diagram of an example detection system.

FIG. 3 is a diagram of an example detection system 300. As shown, the detection system 300 may include terminals 302 of a battery pack, a plurality of battery cells 304 of the battery pack, one or more monitoring devices 306 (e.g., a plurality of monitoring devices 306) of the battery pack, a controller 308 of the battery pack, and an EIS device 310. The battery pack may correspond to the battery pack 100 or the battery pack 200. The monitoring device(s) 306 may correspond to the CMUs 112 or the chip-on-cell devices 212. The controller 308 may correspond to the battery pack controller 110 or the battery pack controller 210.

The EIS device 310 may be separate from the battery pack. For example, the EIS device 310 may be remotely located from the battery pack or otherwise external to the battery pack. The EIS device 310 may include an EIS instrument (e.g., a potentiostat and/or a frequency response analyzer) or a similar device configured to generate an EIS input signal and/or to analyze a response signal to the EIS input signal. The EIS device 310 may apply an EIS input signal to the terminals 302, as described herein. The EIS input signal is an electrical signal. The EIS input signal may have a potentiostatic or galvanostatic mode. For example, the EIS input signal may be an alternating current (AC) signal (e.g., a sinusoidal wave of current or voltage at a fixed frequency). The EIS input signal may be swept across a range of frequencies. At each frequency, a measured voltage response (e.g., a response signal) can be used to determine an AC impedance, thereby resulting in an impedance spectrum (e.g., a plot of impedance magnitude and phase angle as functions of frequency) that can be analyzed by the EIS device 310 (e.g., using mathematical models) to determine electrical properties. In some implementations, rather than sweeping the EIS input signal across a range of frequencies, the EIS input signal may be a multi-frequency signal (e.g., utilizing a sum-of sines techniques that combines multiple frequencies separated by octave harmonics).

The battery pack may receive the EIS input signal applied at the terminals 302 (e.g., injected into the battery pack). The EIS input signal may be applied at the terminals 302 while the battery cells 304 are contained in a housing (e.g., housing 102 or housing 202) of the battery pack. For example, the EIS input signal may be applied at the terminals 302 while the battery cells 304 (e.g., terminals of the battery cells 304) are physically inaccessible from an exterior of the battery pack. In other words, the EIS input signal may be applied at the terminals 302 while the battery pack is in an assembled state (e.g., a housing, or portion thereof, has not been removed from the battery pack) and without any disassembling of the battery pack.

The monitoring device(s) 306 may detect (e.g., measure) respective response signals, responsive to the single EIS input signal, of the battery cells 304 (e.g., the single EIS input signal to the battery pack produces a plurality of response signals that have a resolution down to individual battery cells 304). For example, a plurality of monitoring devices 306 may detect the respective response signals in a synchronized manner, as described herein. A monitoring device 306 may detect a response signal as a voltage measurement (e.g., using a voltage sense connection to a battery cell 304). The monitoring device(s) 306 may detect the respective response signals while the battery pack is in an assembled state.

As described above, the monitoring device(s) 306 may include a plurality of CMUs 112 configured to monitor the battery cells 304 of respective battery modules. Here, in connection with detecting the respective response signals, the CMUs 112 may concurrently (e.g., simultaneously) detect the response signals of their respective battery modules. For example, a first CMU 112 for a first battery module may detect the response signals of the battery cells 304 in the first battery module concurrently as a second CMU 112 of a second battery module detects the response signals of the battery cells 304 in the second battery module, concurrently as a third CMU 112 of a third battery module detects the response signals of the battery cells 304 in the third battery module, and so forth. Furthermore, in connection with detecting the respective response signals, a CMU 112 may sequentially detect the response signals of the battery cells 304 grouped into a battery module monitored by that CMU 112. For example, the CMU 112 of a battery module may detect the response signal of a first battery cell 304 of the battery module, thereafter detect the response signal of a second battery cell 304 of the battery module, thereafter detect the response signal of a third battery cell 304 of the battery module, and so forth.

Additionally, or alternatively, as described above, the monitoring device(s) 306 may include a plurality of chip-on-cell devices 212. Here, in connection with detecting the respective response signals, the chip-on-cell devices 212 may concurrently (e.g., simultaneously) detect response signals of their respective battery cells 304. For example, a first chip-on-cell device 212 may detect the response signal of a first battery cell 304 concurrently as a second chip-on-cell device 212 detects the response signal of a second battery cell 304, concurrently as a third chip-on-cell device 212 detects the response signal of a third battery cell 304, and so forth.

The monitoring device(s) 306 may detect the respective response signals of the battery cells 304 at each different frequency of the EIS input signal. In some implementations, a monitoring device 306 may buffer multiple response signals, relating to respective frequencies of the EIS input signal, for each battery cell 304 monitored by the monitoring device 306 (e.g., for reporting the multiple response signals as a batch, rather than individually reporting the response signal for each frequency). Alternatively, the respective response signals may be multi-frequency response signals responsive to a multi-frequency EIS input signal, as described above. In some implementations, a monitoring device 306 may convert a detected response signal into a particular signal format, a particular data format, or the like, to better facilitate reporting of detected response signals. In some implementations, a monitoring device 306 may associate a detected response signal of a battery cell 304 with a battery cell identifier of the battery cell 304. For example, the battery cell identifier may include a module indication (e.g., module 7) and/or a battery cell indication (e.g., cell 3).

Data indicating the detected respective response signals and identifying which of the battery cells 304 generated the respective response signals may be communicated from the monitoring device(s) 306 to the controller 308 (e.g., in one or more communications from each monitoring device 306). For example, the monitoring device(s) 306 may transmit the data, and the controller 308 may receive the data. Data indicating a response signal may indicate the response signal itself or information representative of the response signal.

As an example, a CMU 112 may sequentially communicate data communications indicating response signals (e.g., the data communications may indicate a single response signal, for a single frequency of the EIS input signal, per battery cell 304, or multiple buffered response signals, for multiple different frequencies of the EIS input signal, per battery cell 304) and battery cell identifiers of battery cells 304 grouped into a battery module monitored by the CMU 112. For example, the CMU 112 may transmit a first data communication indicating the response signal and the battery cell identifier of a first battery cell of the battery module, thereafter transmit a second data communication indicating the response signal and the battery cell identifier of a second battery cell of the battery module, thereafter transmit a third data communication indicating the response signal and the battery cell identifier of a third battery cell of the battery module, and so forth. Additionally, or alternatively, a data communication of the CMU 112 may indicate response signals and associated battery cell identifiers for multiple battery cells in the battery module.

As another example, the chip-on-cell devices 212 may concurrently (e.g., simultaneously) communicate data communications, each indicating a response signal and a battery cell identifier, for their respective battery cells 304. For example, a first chip-on-cell device 212 may communicate a first data communication indicating the response signal and the battery cell identifier of a first battery cell concurrently as a second chip-on-cell device 212 communicates a second data communication indicating the response signal and the battery cell identifier of a second battery cell, concurrently as a third chip-on-cell device 212 communicates a third data communication indicating the response signal and the battery cell identifier of a third battery cell, and so forth.

The controller 308 may transmit the data, received from the monitoring device(s) 306, to the EIS device 310 (e.g., via a communication port of the BMS 108 or the BMS 208). Communication between the controller 308 and the EIS device 310 may use a wireless connection or a wired connection. The controller 308 may transmit the data to the EIS device 310 in real time as the data is communicated to the controller 308 from the monitoring device(s) 306, or the controller 308 may buffer the data communicated from the monitoring device(s) 306 and transmit the data to the EIS device 310 in one or more batches. In some implementations, the controller 308 may perform further processing (e.g., conversion) of the data prior to transmitting the data to the EIS device 310. Because the data indicates respective response signals for each of the battery cells 304, the EIS device 310 can generate per-battery cell impedance spectrums using the data. These per-battery cell impedance spectrums allow the EIS device 310 to determine respective electrical properties (e.g., battery state and health diagnostics) for each of the battery cells 304.

As indicated above, FIG. 3 is provided as an example. Other examples may differ from what is described with regard to FIG. 3.

Figure 4:
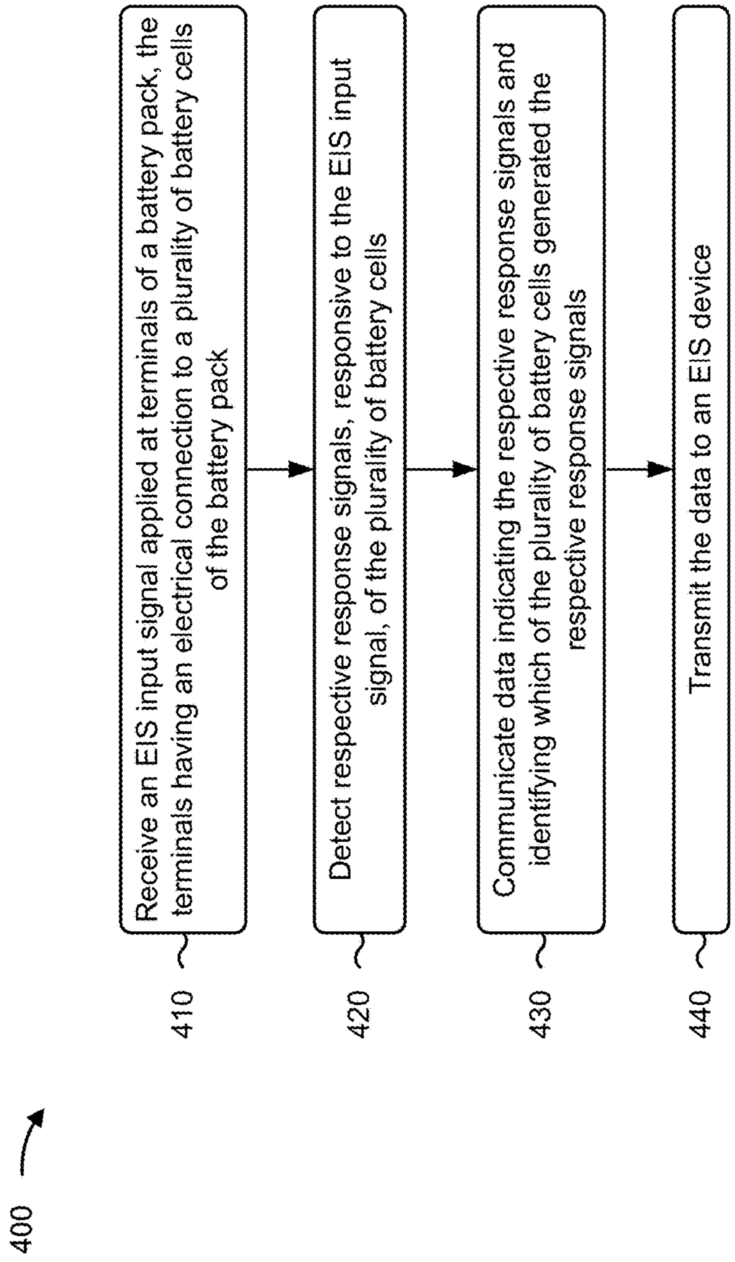
FIG. 4 is a flowchart of an example process associated with battery system diagnostics using EIS.

FIG. 4 is a flowchart of an example process 400 associated with battery system diagnostics using EIS. One or more process blocks of FIG. 4 may be performed by a battery pack (e.g., battery pack 100 or battery pack 200). Additionally, or alternatively, one or more process blocks of FIG. 4 may be performed by another device or a group of devices separate from or including the battery pack, such as another device or component that is internal or external to the battery pack.

As shown in FIG. 4, process 400 may include receiving an EIS input signal applied at terminals of the battery pack, the terminals having an electrical connection to a plurality of battery cells of the battery pack (block 410). For example, the battery pack (e.g., using terminals 302) may receive an EIS input signal, as described above. The EIS input signal may be applied at the terminals of the battery pack while the battery pack is in an assembled state. The plurality of battery cells may be grouped into a plurality of battery modules, and the one or more monitoring devices may include a plurality of CMUs configured to monitor respective battery modules of the plurality of battery modules. Additionally, or alternatively, the one or more monitoring devices may include a plurality of chip-on-cell devices connected to respective battery cells of the plurality of battery cells.

As further shown in FIG. 4, process 400 may include detecting respective response signals, responsive to the EIS input signal, of the plurality of battery cells (block 420). For example, the battery pack (e.g., using one or more monitoring devices 306) may detect the respective response signals, as described above. In some implementations, a first CMU, of the plurality of CMUs, for a first battery module, of the plurality of battery modules, detects response signals of the first battery module concurrently as a second CMU, of the plurality of CMUs, for a second battery module, of the plurality of battery modules, detects response signals of the second battery module. Moreover, a CMU, of the plurality of CMUs, may sequentially detect response signals of battery cells, of the plurality of battery cells, grouped into a battery module monitored by the CMU. In some implementations, a first chip-on-cell device, of the plurality of chip-on-cell devices, detects a response signal of a first battery cell, of the plurality of battery cells, concurrently as a second chip-on-cell device, of the plurality of chip-on-cell devices, detects a response signal of a second battery cell of the plurality of battery cells.

As further shown in FIG. 4, process 400 may include communicating data indicating the respective response signals and identifying which of the plurality of battery cells generated the respective response signals (block 430). For example, the battery pack (e.g., using one or more monitoring devices 306 and/or using controller 308) may communicate the data, as described above. In some implementations, a first chip-on-cell device, of the plurality of chip-on-cell devices, communicates a first data communication indicating a response signal and a battery cell identifier of a first battery cell, of the plurality of battery cells, concurrently as a second chip-on-cell device, of the plurality of chip-on-cell devices, communicates a second data communication indicating a response signal and a battery cell identifier of a second battery cell of the plurality of battery cells.

As further shown in FIG. 4, process 400 may include transmitting the data to an EIS device (block 440). For example, the battery pack (e.g., using controller 308) may transmit the data to an EIS device, as described above.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

INDUSTRIAL APPLICABILITY

The detection system described herein may be used with any battery pack that uses a modular battery cell configuration or a cell-to-pack configuration. For example, the battery pack may be a high-voltage battery pack (e.g., at least 500 volts or at least 1000 volts) of the type used to power an electric vehicle or an electric work machine. The detection system may be used in a battery pack that is undergoing diagnostic testing (e.g., to determine whether the battery pack has suitable capacity and functionality for a particular application), such as EIS testing. Generally in EIS, a single EIS input signal is applied to a battery pack, and a single resulting response signal is output by the battery pack. This single output signal indicates aggregate diagnostic information at the level of the battery pack, but lacks resolution to the level of individual cells of the battery pack. Accordingly, deficiencies of individual cells of the battery pack may go undetected using EIS. Moreover, performing EIS on individual cells of the battery pack may involve disassembling the battery pack and/or modules to allow EIS signals to be applied to cell terminals, module bus bars (e.g., which are welded to terminals of multiple cells), and/or module power terminals. Furthermore, performing EIS on individual cells involves applying an EIS signal to each individual cell or module, and measuring the response signal of each individual cell or module, one at a time, which is slow and inefficient.

The detection system described herein is useful for EIS testing of a multiple-cell battery pack. In particular, the detection system may detect and report respective response signals for the multiple cells in the battery pack. For example, using CMUs and/or chip-on-cell devices to take cell-level measurements facilitates measurement of the EIS responses of individual battery cells from a single EIS input signal applied to the battery pack's power terminals. In this way, the detection system enables the collection of high-resolution (e.g., at an individual cell level), robust data without disassembling the battery pack. Accordingly, the detection system facilitates improved EIS testing of the battery pack.

What is claimed is:

1. A method, comprising:

receiving, by a battery pack, an electrochemical impedance spectroscopy (EIS) input signal applied at terminals of the battery pack, the terminals having an electrical connection to a plurality of battery cells of the battery pack;

detecting, by one or more monitoring devices of the battery pack, respective response signals, responsive to the EIS input signal, of the plurality of battery cells;

communicating, from the one or more monitoring devices to a controller of the battery pack, data indicating the respective response signals and identifying which of the plurality of battery cells generated the respective response signals; and transmitting, by the controller, the data to an EIS device.

2. The method of claim 1, wherein the plurality of battery cells are grouped into a plurality of battery modules, and wherein the one or more monitoring devices comprise a plurality of cell monitoring units (CMUs) configured to monitor respective battery modules of the plurality of battery modules.

3. The method of claim 2, wherein a first CMU, of the plurality of CMUs, for a first battery module, of the plurality of battery modules, detects response signals of the first battery module concurrently as a second CMU, of the plurality of CMUs, for a second battery module, of the plurality of battery modules, detects response signals of the second battery module.

4. The method of claim 2, wherein a CMU, of the plurality of CMUs, sequentially detects response signals of battery cells, of the plurality of battery cells, grouped into a battery module monitored by the CMU.

5. The method of claim 1, wherein the one or more monitoring devices comprise a plurality of chip-on-cell devices connected to respective battery cells of the plurality of battery cells.

6. The method of claim 5, wherein a first chip-on-cell device, of the plurality of chip-on-cell devices, detects a response signal of a first battery cell, of the plurality of battery cells, concurrently as a second chip-on-cell device, of the plurality of chip-on-cell devices, detects a response signal of a second battery cell of the plurality of battery cells.

7. The method of claim 5, wherein a first chip-on-cell device, of the plurality of chip-on-cell devices, communicates a first data communication indicating a response signal and a battery cell identifier of a first battery cell, of the plurality of battery cells, concurrently as a second chip-on-cell device, of the plurality of chip-on-cell devices, communicates a second data communication indicating a response signal and a battery cell identifier of a second battery cell of the plurality of battery cells.

8. The method of claim 1, wherein the EIS input signal is applied at the terminals of the battery pack while the battery pack is in an assembled state.

9. A battery pack, comprising:
- a housing;
- a plurality of battery cells contained in the housing;
- terminals electrically connected to the plurality of battery cells,
  - the terminals accessible from an exterior of the housing;
- one or more monitoring devices configured to:
  - detect, while the battery pack is in an assembled state, respective response signals, responsive to an electrochemical impedance spectroscopy (EIS) input signal applied to the terminals, for the plurality of battery cells; and
- a controller configured to:
  - receive, from the one or more monitoring devices, data indicating the respective response signals and identifying which of the plurality of battery cells generated the respective response signals; and
  - transmit the data to an EIS device.

10. The battery pack of claim 9, wherein the terminals are electrically connected to a plurality of battery modules of the battery pack.

11. The battery pack of claim 9, wherein the plurality of battery cells are grouped into a plurality of battery modules, and
- wherein the one or more monitoring devices comprise a plurality of cell monitoring units (CMUs) configured to monitor respective battery modules of the plurality of battery modules.

12. The battery pack of claim 11, wherein the plurality of CMUs are configured to concurrently detect response signals of the plurality of battery modules, and
- wherein a CMU, of the plurality of CMUs, is configured to sequentially detect response signals of battery cells, of the plurality of battery cells, grouped into a battery module, of the plurality of battery modules, monitored by the CMU.

13. The battery pack of claim 9, wherein the one or more monitoring devices comprise a plurality of chip-on-cell devices connected to respective battery cells of the plurality of battery cells, and
- wherein the plurality of chip-on-cell devices are configured to communicate wirelessly with the controller.

14. The battery pack of claim 13, wherein the plurality of chip-on-cell devices are further configured to:
- concurrently detect response signals of the plurality of battery cells.

15. A detection system for a battery pack, comprising:
- one or more monitoring devices configured to:
  - detect respective response signals, responsive to an electrochemical impedance spectroscopy (EIS) input signal applied to terminals of the battery pack, for a plurality of battery cells electrically connected to the terminals; and
- a controller configured to:
  - transmit, to an EIS device, data indicating the respective response signals and identifying which of the plurality of battery cells generated the respective response signals.

16. The detection system of claim 15, wherein the terminals are pack-level terminals of the battery pack.

17. The detection system of claim 15, wherein the one or more monitoring devices are further configured to:
- buffer multiple response signals, relating to respective frequencies of the EIS input signal, of a battery cell of the plurality of battery cells,
  - wherein the data indicates the multiple response signals.

18. The detection system of claim 15, wherein the plurality of battery cells are grouped into a plurality of battery modules, and
- wherein the one or more monitoring devices comprise a plurality of cell monitoring units (CMUs) configured to monitor respective battery modules of the plurality of battery modules.

19. The detection system of claim 18, wherein the plurality of CMUs are configured to concurrently detect response signals of the plurality of battery modules, and
- wherein a CMU, of the plurality of CMUs, is configured to sequentially detect response signals of battery cells, of the plurality of battery cells, grouped into a battery module, of the plurality of battery modules, monitored by the CMU.

20. The detection system of claim 15, wherein the one or more monitoring devices comprise a plurality of chip-on-cell devices, connected to respective battery cells of the plurality of battery cells, configured to:
- concurrently detect response signals of the plurality of battery cells.

* * * * *